US007004782B2

(12) United States Patent
Kroenung

(10) Patent No.: US 7,004,782 B2
(45) Date of Patent: Feb. 28, 2006

(54) CONNECTING DEVICE FOR ELECTRICAL CONNECTION OF A SOCKET OF AN ELECTRICAL APPARATUS WITH A POWER CORD PLUG

(75) Inventor: Karl Kroenung, Hofbieber (DE)

(73) Assignee: Wella AG, Darmstadt (DE)

( * ) Notice: Subject to any disclaimer, the term of this patent is extended or adjusted under 35 U.S.C. 154(b) by 0 days.

(21) Appl. No.: 11/048,938

(22) Filed: Feb. 2, 2005

(65) Prior Publication Data

US 2005/0176287 A1 Aug. 11, 2005

(30) Foreign Application Priority Data

Feb. 10, 2004 (DE) .................. 20 2004 002 017 U

(51) Int. Cl.
*H01R 13/58* (2006.01)

(52) U.S. Cl. ...................................... 439/456; 439/371

(58) Field of Classification Search ........ 439/456–459, 439/501, 371

See application file for complete search history.

(56) References Cited

U.S. PATENT DOCUMENTS

| | | | | |
|---|---|---|---|---|
| 1,537,160 | A * | 5/1925 | Diehl | 439/658 |
| 1,977,347 | A * | 10/1934 | Namet | 191/12 R |
| 2,228,333 | A * | 1/1941 | Abbott | 439/670 |
| 3,336,567 | A * | 8/1967 | Coldren | 439/685 |
| 5,071,367 | A * | 12/1991 | Luu | 439/501 |
| 6,050,840 | A * | 4/2000 | Kowalski et al. | 439/369 |
| 6,077,109 | A * | 6/2000 | Prazoff | 439/501 |
| 6,848,937 | B1 * | 2/2005 | Hsiao | 439/528 |

* cited by examiner

*Primary Examiner*—P. Austin Bradley
*Assistant Examiner*—Phuongchi Nguyen
(74) *Attorney, Agent, or Firm*—Michael J. Striker

(57) ABSTRACT

The connecting device (1) for electrical connection of a socket (2) of an electrical apparatus (3) with a socket plug (4) of a power cord (5) includes a cord receptacle (19) provided with curved first and second receptacle sections (7, 8) on opposite sides of the socket (2). The curved first and second receptacle sections (7, 8) are dimensioned so that a power cord loop (9) wrapped around the socket plug (4) can be held fixed in a first seat (10) in the first receptacle section and in a second seat (11) in the second receptacle section of the cord receptacle (19). Because of that unintended interruption of electrical power supplied to the electrical apparatus by unintentionally pulling the socket plug of the power cord out of the socket of the electrical apparatus is avoided.

10 Claims, 5 Drawing Sheets

CONNECTING DEVICE FOR ELECTRICAL CONNECTION OF A SOCKET OF AN ELECTRICAL APPARATUS WITH A POWER CORD PLUG

BACKGROUND OF THE INVENTION

The present invention relates of a connecting device for electrical connection of a socket of an electrical apparatus with a socket plug, which, in turn, is connected by means of a power cord with a power line plug in order to supply the electrical apparatus with electrical power.

This sort of connecting device is known in the electrical arts. This connecting device is used to connect a standard socket of a movable electrical apparatus with a standard socket plug for the electrical apparatus. The standard socket plug is connected with a power line plug by a power cord, so that the movable electrical apparatus can be supplied with electrical energy when the power line plug is connected with the electrical power and the standard socket plug of the power cord is plugged into the standard socket of the movable electrical apparatus.

It is disadvantageous that in the case of the known electrical apparatus the standard socket plug can be pulled out of the socket of the movable electrical apparatus by unintentionally pulling on the power cord, so that the electrical power supplied to the electrical apparatus is interrupted.

SUMMARY OF THE INVENTION

It is an object of the present invention to provide a connecting device for electrical connection of a socket of an electrical apparatus with a socket plug of a power cord of the above-described type, which overcomes the above-described disadvantage by simple features without changing the standard socket for the electrical apparatus and the standard socket plug.

It is also an object of the present invention to provide a connecting device for electrical connection of a socket of an electrical apparatus with a socket plug of a power cord of the above-described type, which prevents the socket plug from being disconnected from the socket by unintentionally pulling on the power cord.

This object and others, which will be made more apparent hereinafter, are attained in a connecting device for electrical connection of a socket of an electrical apparatus with a socket plug of a power cord, which, in turn, is connected by means of a power cable with a power line plug in order to supply the electrical apparatus with electrical power.

According to the invention curved first and second receptacle sections are provided at least on opposite sides of the socket and are dimensioned so that a loop of the power cord formed around the socket plug is held fixed by the socket plug in a first seat in the curved first receptacle section and in a second seat in the curved second receptacle section of a cord receptacle provided in the electrical apparatus.

In a preferred embodiment of the connecting device a beginning and an end of the power cord loop are conducted out from one side of a plane of the cord loop extending between the curved first and the curved second receptacle sections and the end of the power cord loop is connected with the socket plug by a curved portion of the power cord loop.

In other embodiments of the invention power cord loop extends over an approximately 230 to 270° of arc.

In a particularly preferred embodiment the cold apparatus is a lighting apparatus, such as a floor lamp, comprising a lamp support or stand.

The invention also includes an improved electrical apparatus, especially a movable apparatus, for example a floor lamp, which includes the improved connecting device described above and at least one power cord of a predetermined length.

BRIEF DESCRIPTION OF THE DRAWING

The objects, features and advantages of the invention will now be illustrated in more detail with the aid of the following description of the preferred embodiments, with reference to the accompanying figures in which.

DETAILED DESCRIPTION OF THE INVENTION

Figures 1, 2:
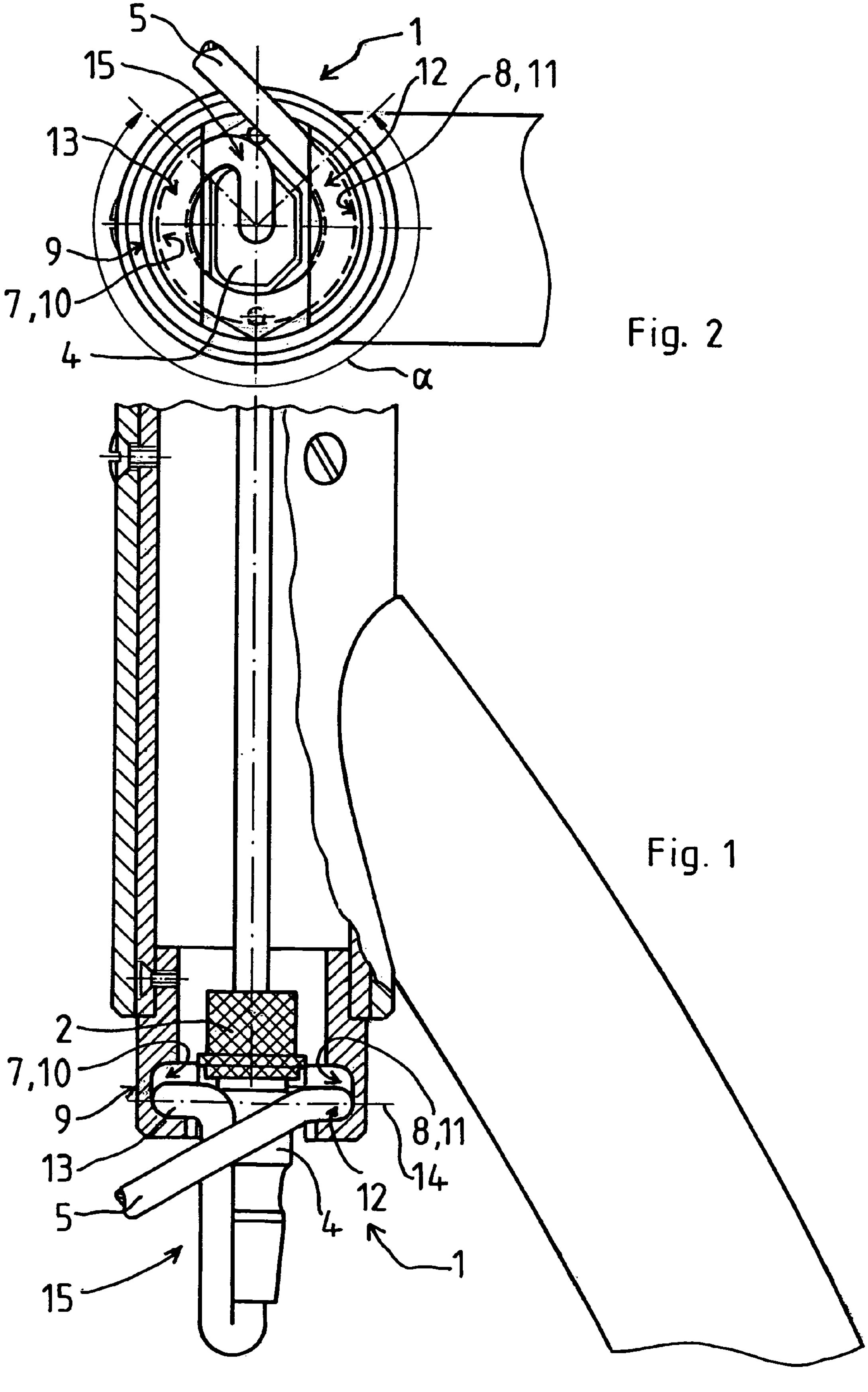
FIG. 1 is a partially side, partially vertical cross-sectional cutaway view of a connecting device according to the invention for electrical connection of a socket of an electrical apparatus with a socket plug of a power cord.
FIG. 2 is a bottom plan view of the connecting device shown in FIG. 1.

FIG. 1 shows a connecting device for making an electrical connection between a standard cold apparatus-socket 2 of a mobile electrical apparatus 3 and a standard cold apparatus-socket plug 4, which is connected by a power cord 5 with a power cord plug 6 for supplying the electrical apparatus 3 with electrical power. Curved first and curved second receptacle sections 7, 8 are provided on at least two opposing sides of the cold apparatus-socket 2 attached to the electrical apparatus 3. The curved first and second receptacle sections 7, 8 are dimensioned so that that a loop 9 of the power cord 5 formed around the cold apparatus-socket plug 4 is held fixed by the cold apparatus-socket plug 4 in a first seat 10 in the curved first receptacle section 7 and in a second seat 11 in the second receptacle section 8 of a cord receptacle 19 provided in the electrical apparatus 3.

A beginning 12 and an end 13 of the power cord loop 9 are conducted out from one side of a plane 14 of the power cord loop 9 extending between the curved first and the curved second receptacle sections 7, 8. The end 13 of the power cord loop 9 is connected with the cold apparatus-socket plug 4 of the electrical apparatus 3 by a curved portion 15 (FIG. 7) of the power cord loop. The power cord loop 9 extends over an arc of approximately 230 to 270° (α). Because of this feature it is guaranteed that the cold apparatus-socket plug 4 cannot be pulled from the cold apparatus-socket 2.

According to choice the cold apparatus-socket plug 4 can be connected with the cold apparatus-socket 2 with the connection device according to the invention in a manner that is safe from unintended pull out or the cold apparatus-socket plug 4 can be connected with the cold apparatus-socket 2, but not with the connection device according to the invention.

The connection device 1 is attached with three screws to the electrical apparatus 3 (supporting pipe 18). The cold apparatus-socket 2 is attached with two screws to the connecting device 1. None of these parts may be disassembled for rigid connection of the power cord 5 to the electrical apparatus 3.

Figure 6:
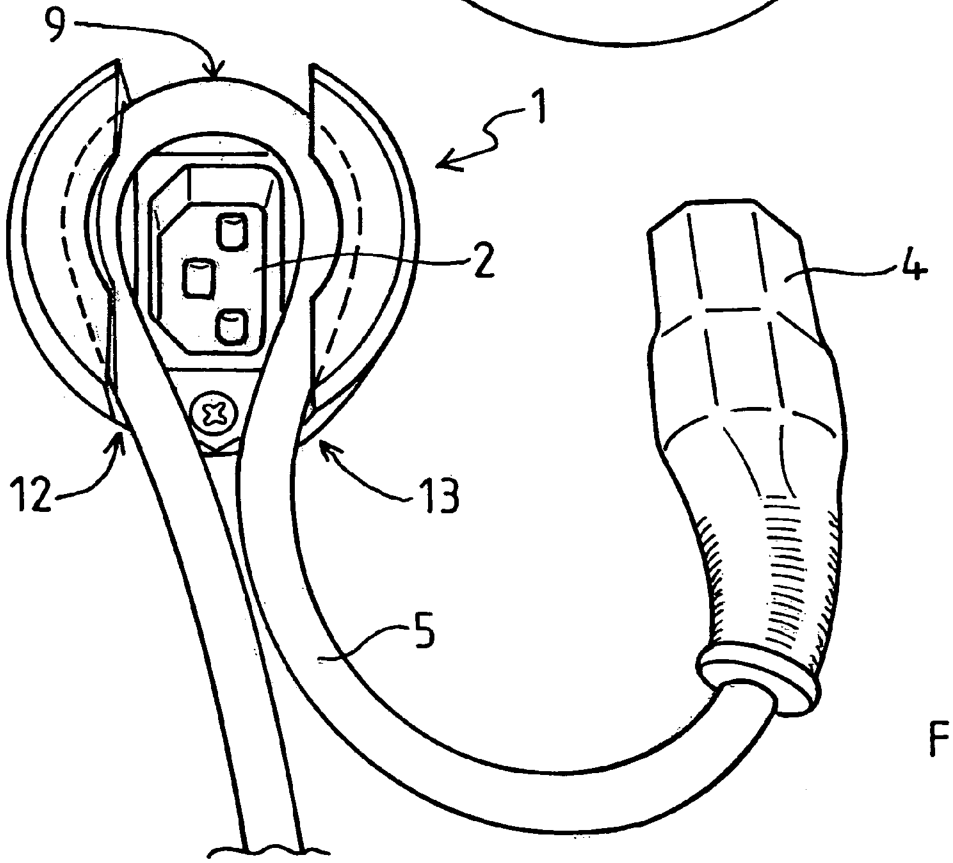
FIG. 6 is a perspective action view similar to FIG. 5 but with the loop of the power cord engaged in the curved first and second receptacle sections associated with the socket.
Figure 7:
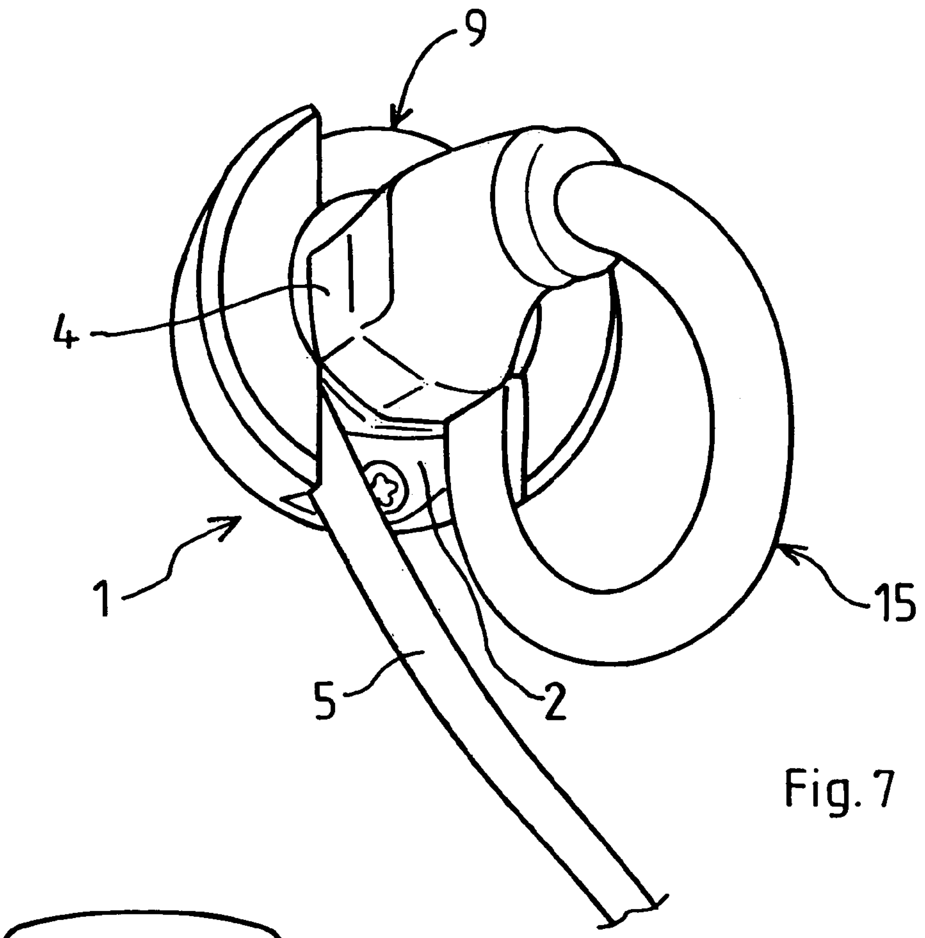
FIG. 7 is another perspective action view in which the socket plug is connected with the socket of the electrical apparatus and the loop of the power cord is engaged in the first and second receptacle sections associated with the socket.
Figure 8:
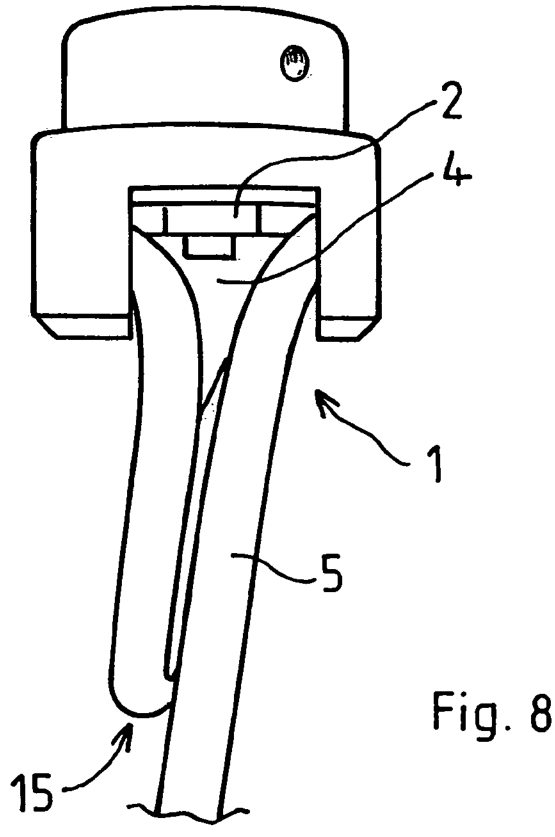
FIG. 8 is another view showing the arrangement of FIG. 7 from below.

As seen in FIGS. 6 to 8 the power cord 5 is formed in a loop 9 and laid in the connecting device 1 or in the curved first and second receptacle sections 7, 8 of the cord receptacle 19. Then the cold apparatus-socket plug 4 is inserted by passing it through the power cord loop 9 in the cold apparatus-socket 2. If the power cord 5 is now pulled, the power cord 5 is fixed by means of the loop 9 around the cold apparatus-socket plug 4, so that the cold apparatus-socket plug 4 is pulled to the cold apparatus-socket 2 and thus cannot be pulled out (see FIG. 7).

In order to break the connection between the cold apparatus-socket plug 4 and the cold apparatus-socket 2 first the cold apparatus-socket plug 4 must be pulled out of the cold apparatus socket 2. After that the power cord loop 9 of the power cord 5 is taken out of the first and second receptacle sections 7, 8, while the cold apparatus socket plug 4 is removed from the vicinity of the socket 2.

The electrical apparatus 3 can be connected with standard power cords 5 of different lengths when the connection device according to the invention is built into it. This electrical apparatus 3 is thus advantageous in comparison to similar electrical apparatus that is provided with a power cord 5 that is attached to it so that it cannot be disconnected from it and has a fixed predetermined length.

FIG. 2 shows the embodiment of the connecting device 1 according to the invention shown in FIG. 1, however from the bottom.

Figure 3:
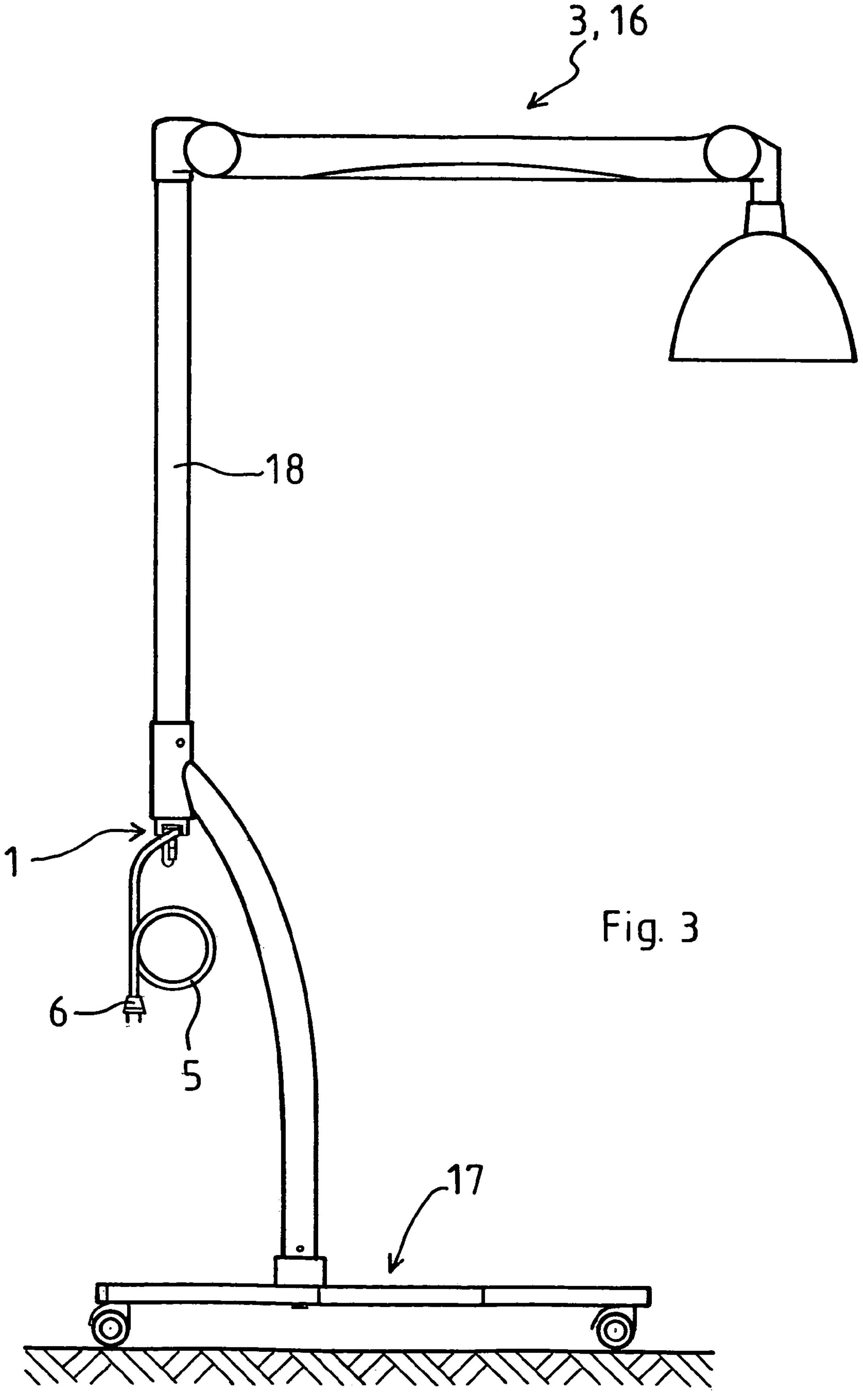
FIG. 3 is a side view of the electrical apparatus, namely a movable floor lamp, which includes the connecting device for electrical connection according to the invention shown in FIG. 1.

FIG. 3 shows the connecting device 1 according to FIG. 1, however in a side view of the entire electrical apparatus 3, which for example can be provided as a movable floor lamp 16 with a rolling stand or base 17. The floor lamp 16 is provided with a vertical supporting pipe 18, which has the connecting device 1 at its lower free end. The advantages of the connecting device 1 according to the invention, in which the socket plug is secured to prevent unintended power interruption, are especially evident this arrangement with a downwardly directed cold apparatus-socket 2 in the electrical apparatus 3.

Figure 4:
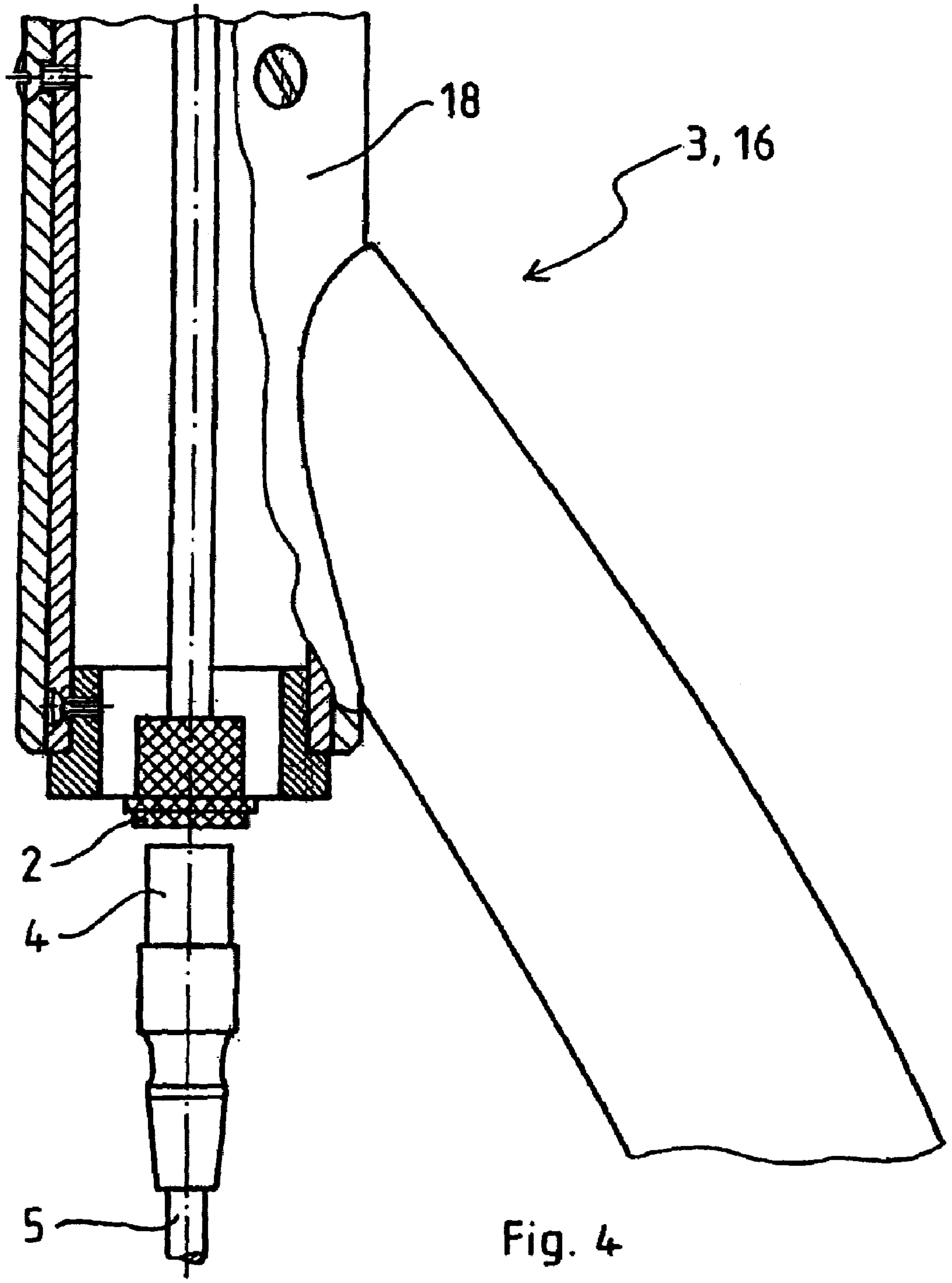
Fig. 4 PRIOR ART
FIG. 4 is a partially side, partially vertical cross-sectional cutaway view of a connecting device for electrical connection of a socket of an electrical apparatus with a socket plug according to the prior art.

FIG. 4 shows an electrical apparatus of the prior art similar to the apparatus of the invention shown in FIG. 1, however without the connecting device 1 according to the invention.

Figure 5:
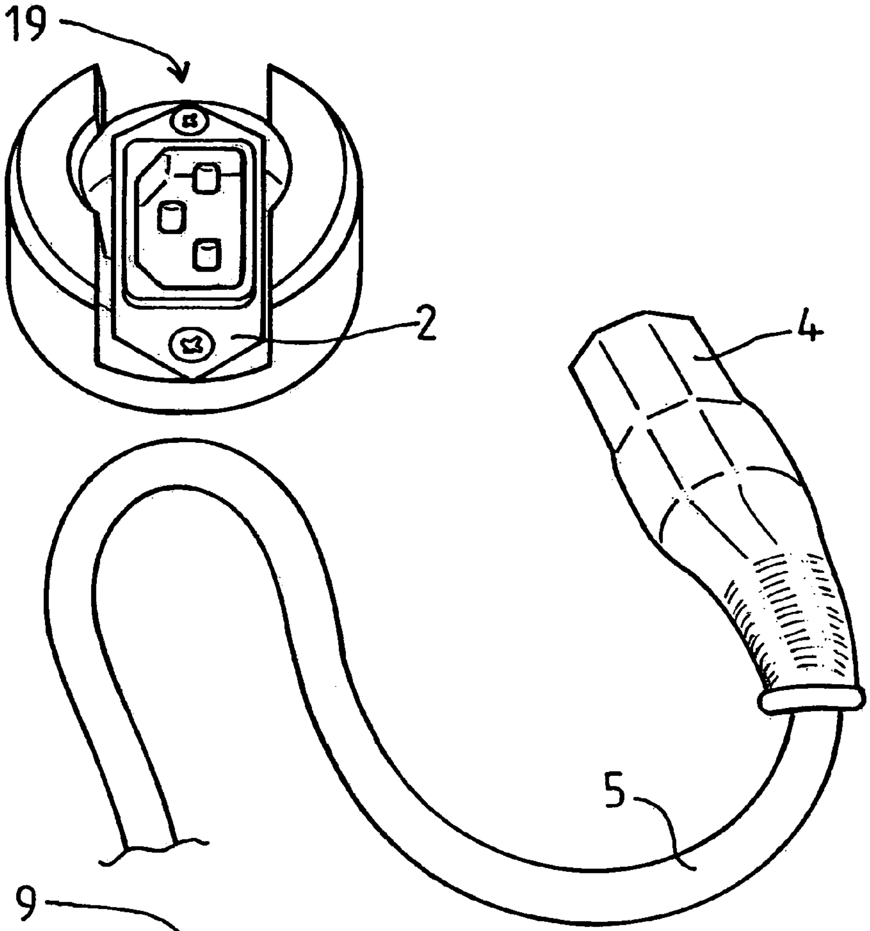
FIG. 5 is a perspective action view of the receptacle of the connecting device with the socket and an end section of the power cord with the socket plug prior to engaging the loop of the power cord in the receptacle.

FIGS. 5 to 8 are successive action views showing how the cold apparatus-socket plug 4 is secured from unintended pull out from the socket 2 with the connecting device 1 according to the invention. FIG. 5 shows the power cord 5 with the socket plug 4 and the cord receptacle 19 prior to securing the power cord 5 in the cord receptacle 19. The cord receptacle 19 with the first and section receptacle sections 7, 8 is made by milling, in order to obtain a simple connection of the socket 2 in the cord receptacle 19.

FIG. 6 shows the connecting device according to FIG. 5, but with a single power cord loop 9 laid in the first and second receptacle sections.

FIG. 7 shows the connecting device 1 according to FIG. 6, but with the cold apparatus-socket plug 4 plugged into the cold apparatus-socket 2 passing through the power cord loop 9 in an especially clear illustration of the fixed position, which prevents unintentional pulling out of the socket plug 4.

FIG. 8 shows the connecting device 1 in the configuration shown in FIG. 7, but from below.

| | |
|---|---|
| 1 | connecting device |
| 2 | socket |
| 3 | electrical apparatus |
| 4 | socket plug |
| 5 | power cord |
| 6 | power cord plug |
| 7 | first receptacle section |
| 8 | second receptacle section |
| 9 | power cord loop |
| 10 | first seat |
| 11 | second seat |
| 12 | beginning of the cord loop 9 |
| 13 | end of cord loop 9 |
| 14 | plane of cord loop 9 |
| 15 | curved portion |
| 16 | lamp support |
| 17 | rolling stand |
| 18 | supporting pipe |
| 19 | cord receptacle |
| α | angle of the cord loop 9 |

The disclosure in German Patent Application 20 2004 002 017.3 of Feb. 10, 2004 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a connecting device for electrical connection of a socket of an electrical apparatus with a socket plug of a power cord, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

I claim:

1. A connecting device for electrical connection of a socket (2) of an electrical apparatus (3) with a socket plug (4) of a power cord (5) in order to supply the electrical apparatus (3) with electrical power, said connecting device (1) comprising a cord receptacle (19) associated with the socket (2), said cord receptacle being provided with a curved first receptacle section (7) and a curved second receptacle section (8) at least on two opposite sides of the socket (2);

wherein said curved first receptacle section (7) and said curved second receptacle section (8) are dimensioned so that a loop (9) of the power cord (5) formed around the socket plug (4) is held fixed by the socket plug (4) in a first seat (10) in the curved first receptacle section and in a second seat (11) in the curved second receptacle section of the cord receptacle (19).

2. The connecting device as defined in claim 1, wherein said power cord loop (9) has a beginning (12) and an end (13) conducted out from one side of a plane (14) of the power cord loop (9) extending between the curved first receptacle section (7) and the curved second receptacle section (8) and the end (13) of the power cord loop (9) is connected with the socket plug (4) by a curved portion (15) of the power cord loop (9).

3. The connecting device as defined in claim 1, wherein the power cord loop (9) extends over an arc of approximately 230 to 270°.

4. The connecting device as defined in claim 1, wherein the electrical apparatus (3) is a lighting apparatus including a lamp support (16).

5. The connecting device as defined in claim 4, wherein the lighting apparatus is a floor lamp.

6. An electrical apparatus (3) comprising at least one power cord (5) of a predetermined length for supplying electrical power, said at least one power cord (5) having a power cord plug (6) at one end and a socket plug (4) at another end; and a connecting device (1) comprising a cord receptacle (19) with an associated socket (2) for connection with the socket plug (4) of the at least one power cord (9), said cord receptacle being provided with a curved first receptacle section (7) and a curved second receptacle section (8) at least on two opposite sides of the socket (2); and wherein said curved first receptacle section (7) and said curved second receptacle section (8) are dimensioned, so that a loop (9) of the power cord (5) formed around the socket plug (4) is held fixed by the socket plug (4) in a first seat (10) in the curved first receptacle section and in a second seat (11) in the curved second receptacle section of the cord receptacle (19).

7. The electrical apparatus as defined in claim 6, wherein said power cord loop (9) has a beginning (12) and an end (13) conducted out from one side of a plane (14) of the power cord loop (9) extending between the curved first receptacle section (7) and the curved second receptacle section (8) and the end (13) of the power cord loop (9) is connected with the socket plug (4) by a curved portion (15) of the power cord loop (9).

8. The electrical apparatus as defined in claim 7, wherein the power cord loop (9) extends over an arc of approximately 230 to 270°.

9. The electrical apparatus as defined in claim 7, consisting of a lighting apparatus including a lamp support (16).

10. The electrical apparatus as defined in claim 9, further comprising a rolling stand (17) and a supporting pipe (18) connecting the lamp support (16) and the rolling stand (17).

* * * * *